(12) United States Patent
Hwang

(10) Patent No.: US 6,972,968 B2
(45) Date of Patent: *Dec. 6, 2005

(54) SHIELDING CAGE ASSEMBLY ADAPTED FOR DENSE TRANSCEIVER MODULES

(75) Inventor: Jeng-Yih Hwang, Irvine, CA (US)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 176 days.

This patent is subject to a terminal disclaimer.

(21) Appl. No.: 10/623,415

(22) Filed: Jul. 18, 2003

(65) Prior Publication Data

US 2005/0013126 A1    Jan. 20, 2005

(51) Int. Cl.[7] ............................................. H05K 9/00
(52) U.S. Cl. ...................... 361/818; 361/800; 361/816; 174/35 R
(58) Field of Search ............................. 361/818, 800, 361/816, 732, 741, 740; 174/35 R, 35 MS; 439/607, 608

(56) References Cited

U.S. PATENT DOCUMENTS

| | | | |
|---|---|---|---|
| 6,724,641 B1 * | 4/2004 | Hwang | 361/818 |
| 6,729,905 B1 * | 5/2004 | Hwang | 439/607 |
| 6,731,519 B1 * | 5/2004 | Hwang | 361/818 |
| 6,824,429 B2 * | 11/2004 | Hwang | 439/607 |
| 6,866,544 B1 * | 3/2005 | Casey et al. | 439/607 |

* cited by examiner

Primary Examiner—Kamand Cuneo
Assistant Examiner—Hung S. Bui
(74) Attorney, Agent, or Firm—Wei Te Chung

(57) ABSTRACT

A transceiver module assembly includes a printed circuit board (4), a plurality of transceiver modules, a plurality of electrical connectors (6) adapted to connect between the plurality of transceiver modules and the printed circuit board, and a shielding cage assembly (10) which is mounted to the printed circuit board for receiving the transceiver modules and the electrical connectors therein. The shielding cage assembly includes at least one shielding cage (21, 22), a spacer (3), and a hanger (1). The at least one shielding cage and the spacer are mechanically retained in the hanger, and the spacer mechanically engages with the shielding cage for good air ventilation.

22 Claims, 6 Drawing Sheets

US 6,972,968 B2

SHIELDING CAGE ASSEMBLY ADAPTED FOR DENSE TRANSCEIVER MODULES

BACKGROUND OF THE INVENTION

1. Field of the Invention

This invention relates generally to a cage for shielding components from electromagnetic interference, and more particularly to a shielding cage assembly for arranging a plurality of transceiver modules therein. A copending application filed Jun. 6, 2003 and titled "2×4 SHIELDING CAGE ASSEMBLY ADAPTED FOR MULTIPLE TRANSCEIVER MODULES" and having the same applicant and the same assignee with as the instant application, and a contemporaneously filed application having the same title, the same applicant and the same assignee as the instant application, are both referred hereto.

2. Description of the Related Art

A transceiver module is a discrete unit used in interface communication equipment, and is normally singly received in a cage that provides shielding against electromagnetic interference (EMI). Prior art shielded transceiver modules are too difficult to assemble densely to a circuit board. Therefore, an inexpensive shielding cage assembly that will allow transceiver modules to be easily and densely mounted on a circuit board is required.

Referring to FIG. 6, a prior art shielding cage assembly 100 for shielding a plurality of transceiver modules (not shown) therein includes a conductive body cage 101, a conductive cover cage 102 and a plurality of dividing walls 103, which cooperatively define a plurality of hollow spaces for receiving the transceiver modules therein. Retaining tabs 121, 311 are respectively formed on the body cage 101 and on the dividing walls 103, and engage in a corresponding plurality of slots 24a, 24 defined in the cover cage 102 to hold the cover cage 102 to the body cage 101 and to fix the dividing walls 103 between the cover cage 102 and body cage 101.

However, this kind of structure cannot satisfy the requirement to stackably mount transceiver modules in interface communication equipment. Therefore, an improved shielding cage assembly that is adapted for stackably receiving a plurality of transceiver modules therein is desired.

SUMMARY OF THE INVENTION

An object of the present invention is to provide a shielding cage assembly for receiving a plurality of transceiver modules therein while allowing good air ventilation.

A transceiver module assembly includes a printed circuit board, a plurality of transceiver modules, a plurality of electrical connectors adapted to connect between the plurality of transceiver modules and the printed circuit board, and a shielding cage assembly which is mounted to the printed circuit board for receiving the transceiver modules and the electrical connectors therein. The shielding cage assembly includes at least one shielding cage, a spacer, and a hanger. The at least one shielding cage and the spacer are mechanically retained in the hanger, and the spacer mechanically engages with the shielding cage for good air ventilation.

Other objects, advantages and novel features of the present invention will be drawn from the following detailed description of a preferred embodiment of the present invention with attached drawings, in which:

DETAILED DESCRIPTION OF THE PREFERRED EMBODIMENT

Figure 1:
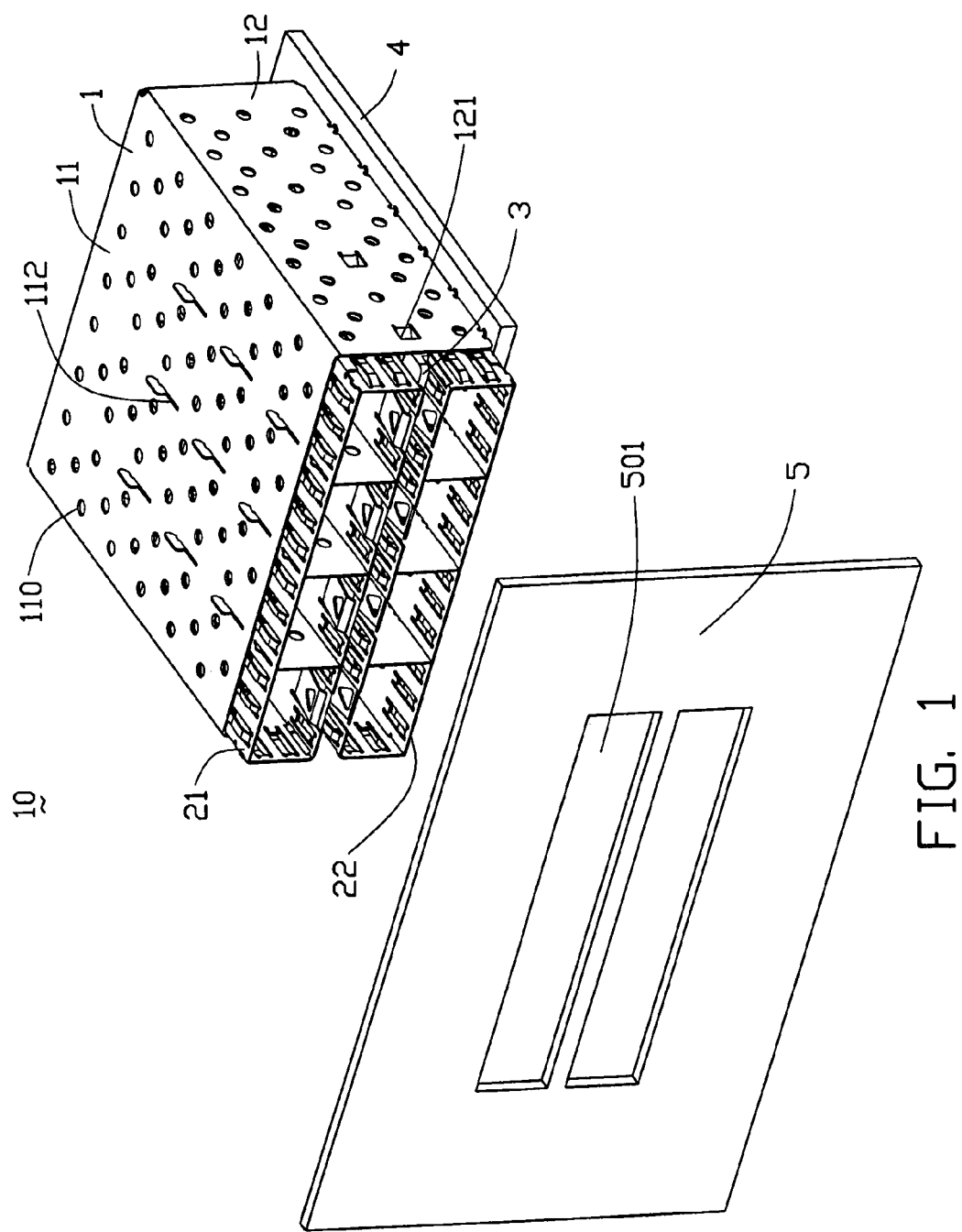
FIG. 1 is an isometric view of an assembly in accordance with the present invention, together with a panel prior to engagement therewith, the assembly comprising a shielding cage assembly mounted to a printed circuit board.

Referring also to FIG. 1, a shielding cage assembly 10 in accordance with the present invention includes a metal hanger 1, an upper shielding cage 21, a lower shielding cage 22 and a spacer 3. The hanger 1 covers the upper and lower shielding cages 21, 22 and the spacer 3.

Figure 2:
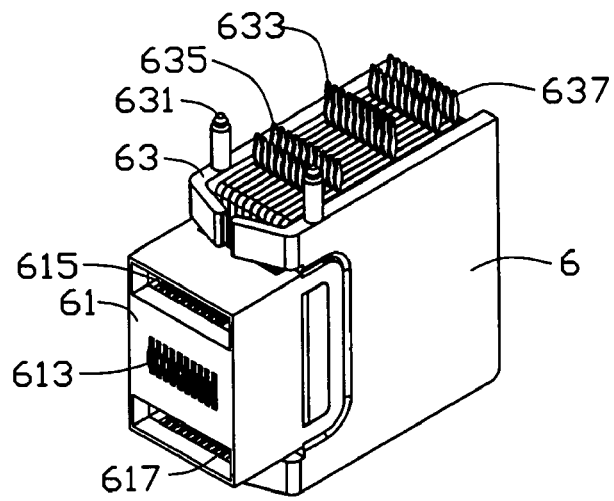
FIG. 2 is an exploded, inverted view of the shielding cage assembly of FIG. 1, but showing only one of electrical connectors thereof.
Figure 2:
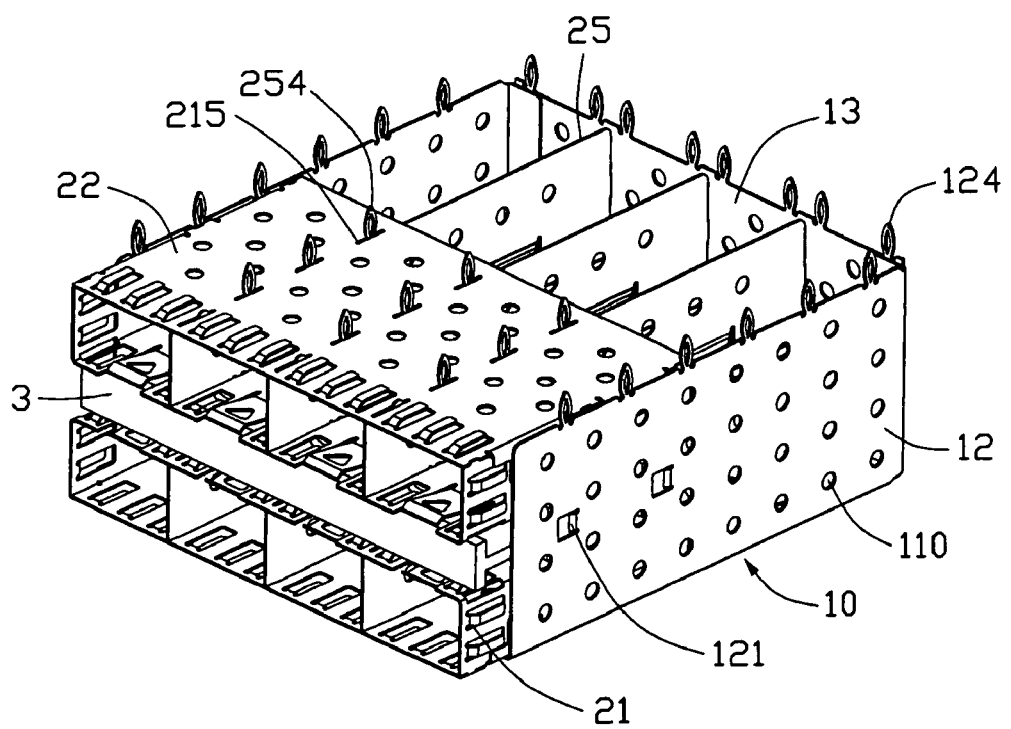

Referring also to FIG. 2, the hanger 1 is formed from a single sheet of metal and is pressed into a rectangular receptacle box, which includes a top wall 11, two side walls 12 extending downwardly therefrom, and a rear wall 13 extending between the two side walls 12. An opening (not labeled) is formed by the top and side walls 11, 12, which opening has a rearward boundary at the rear wall 13. A plurality of mounting pins 124 with needle-eyes therethrough respectively extends downwardly from the side and rear walls 12, 13. A plurality of slits 112 is defined through the top wall 11, arranged in parallel lines in a frontward to rearward direction. A pair of inward tabs 121 extends from each side wall 12 to engage with the spacer 3, which is received in the hanger 1, to help support a weight of the upper and lower shielding cages 21, 22 mounted thereto. A plurality of through holes 110 is defined through all the walls 11, 12, 13 of the hanger 1, for dissipation of heat generated in transceiver modules received in the shielding cage assembly 10.

Figure 3:
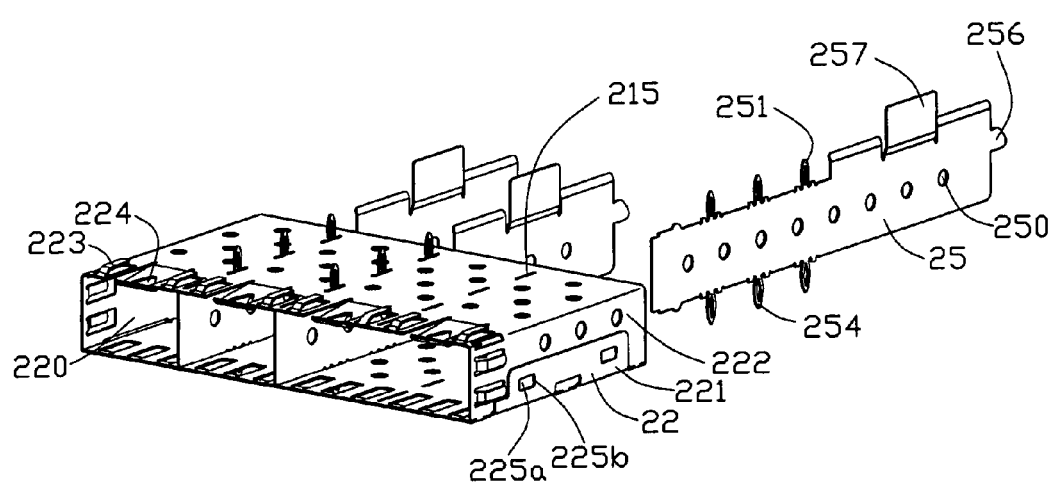
FIG. 3 is an exploded, isometric view of a lower shielding cage of the shielding cage assembly of FIG. 1, showing a lower dividing wall separated from the lower shielding cage.

Referring to FIGS. 1 to 3, the lower shielding cage 22 includes a conductive first portion 221 and a conductive second portion 222. The first portion 221 covers the second portion 222. The side walls of the first and second portions 221, 222 are interlocking. A pair of retaining tabs 225a formed in each side of the second portion 222 is received in a pair of receiving slots 225b defined in each side of the first portion 221, for hand soldering together side walls of the first and second portions on both sides. A plurality of notches 215 is defined through the second portion 222 and the first portion 221, the notches 215 being arranged in parallel lines in a frontward to rearward direction. A plurality of ground tabs 223 is formed near an opening 220 of the lower shielding cage 22, for making a grounding contact with sides of a corresponding aperture 501 of a panel 5 of a system assembly (not shown). A plurality of releasing tabs 224 extends inwardly at an angle from the second portion 222 into the opening 220. Each releasing tab 224 defines a triangular shaped opening (not labeled) therethrough for securing a transceiver module therein. The releasing tab 224 can be pushed upwardly to remove the transceiver module from the shielding cage assembly 10.

A plurality of conductive lower dividing walls 25 is inserted in the lower shielding cage 22 and divides an inner space of the lower shielding cage 22 into a plurality of channels (for example, FIG. 1 shows a 2×4 format shielding cage assembly having four channels per shielding cage 21, 22). Each channel receives a transceiver module therein. Each lower dividing wall 25 is elongated, and includes a plurality of mounting pins 251 extending upwardly from an upper, forward edge thereof and a plurality of mounting pins 254 extending downwardly from a lower, forward edge thereof. Each mounting pin 251, 254 defines a needle eye therethrough. A protrusion 257 extends from an upper, rearward edge of the dividing wall 25. A back tab 256 extends rearwardly from an end of the dividing wall 25. A plurality of through holes 250 is defined through the dividing wall 25 for good air ventilation. The mounting pins 251 pass through the corresponding notches 215 of the second portion 222, and the mounting pins 254 pass through the corresponding notches 215 of the first portion 221.

Figure 5:
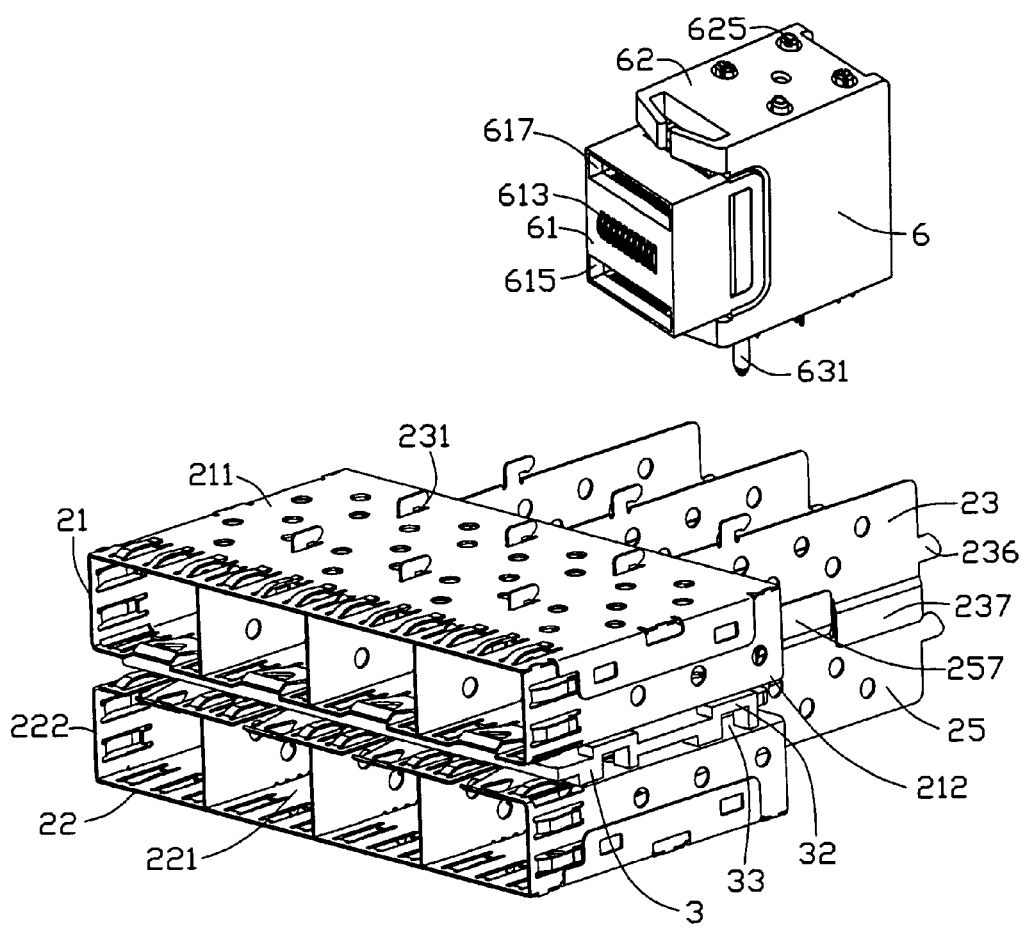
FIG. 5 is an exploded view of the shielding cage assembly of FIG. 1, but showing only one of the electrical connectors thereof, and not showing a hanger thereof.
Figure 6:
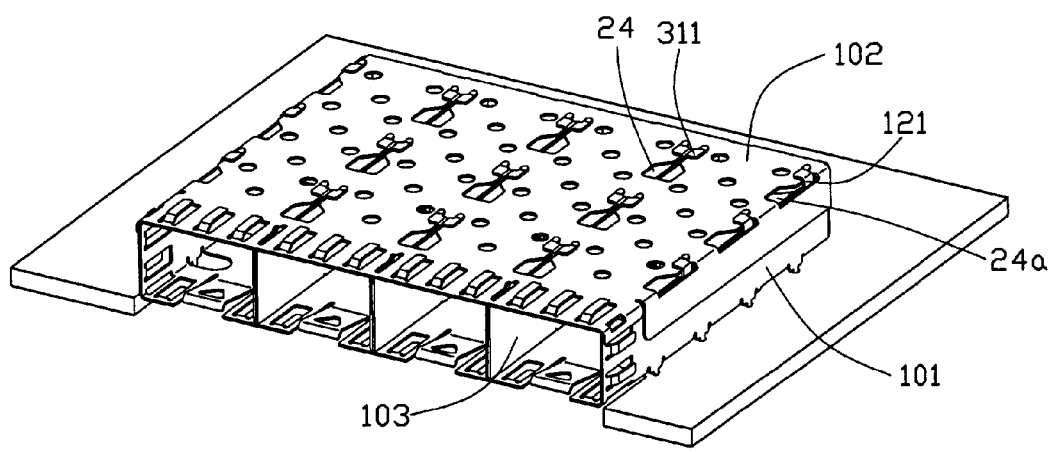
FIG. 6 is an isometric view of a shielding cage assembly according to the prior art.

Referring to FIG. 5, the conductive upper shielding cage 21 is substantially similar to the lower shielding cage 22 in structure. A plurality of conductive upper dividing walls 23 is received in the upper shielding cage 21. The upper dividing walls 23 are similar to the lower dividing walls 25 received in the lower shielding cage 22, one difference being a plurality of retaining tabs 231 being formed on an upper edge of the upper dividing wall 23 in place of the mounting pins 251 of the lower dividing wall 25. The retaining tabs 231 pass through notches (not labeled) of a first portion 211. Similarly, a plurality of mounting pins 234 (not shown) formed on a lower edge of the upper dividing wall 23 and similar to the mounting pins 254 of the lower dividing wall 25 pass through corresponding notches (not shown) defined in a second portion 212, said notches being similar to the notches 215 in the lower shielding cage 22. A back tab 236 is similar to the back tab 256 in the lower dividing wall 25. A protrusion 237 extends from a lower, rearward edge of the dividing wall 23.

Figure 4:
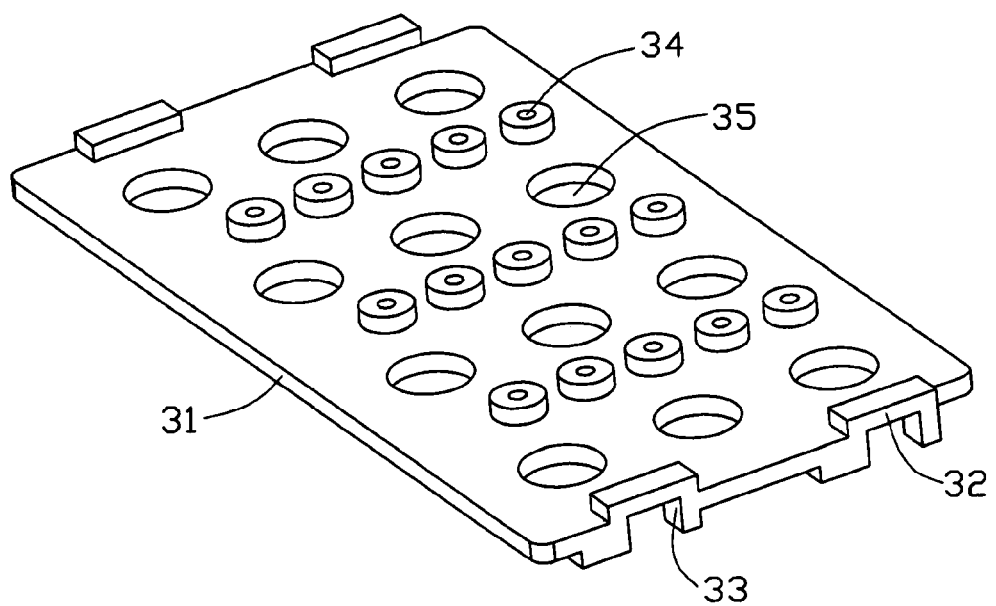
FIG. 4 is an isometric view of a spacer of the shielding cage assembly of FIG. 1.

Referring to FIG. 4, the spacer 3 is die-cast and is made of a lightweight material, such as aluminum alloy, zinc alloy, or plastic coated with a conductive material. This kind of spacer 3 has good electrical and thermal conductivities for EMI continuity and heat dissipation. The spacer 3 includes a rectangular base 31, and has a pair of bulges 32 extending from each of two opposite sides of the base 31, wherein each bulge 32 defines a recess 33 at a bottom of the base 31. A plurality of extending posts (not labeled), each defining a press-fit hole 34 therethrough, is formed on the base 31. The extending posts are arranged in lines, for the press-fit holes 34 to receive the mounting pins 234, 251 of the upper and lower dividing walls 23, 25 therein. A plurality of venting holes 35 is defined through the base 31. This structure of the spacer 3 allows air to flow freely in all directions around the spacer 3. A front edge (not labeled) of the spacer 3 provides a stop feature when the shielding cage assembly 10 is inserted in the apertures 501 of the panel 5 of the system assembly.

Referring to FIGS. 2 and 5, a two-port electrical connector 6 is positioned to a rear of each pair of stacked channels of the shielding cage assembly 10. Each electrical connector 6 includes a front interface 61, a top surface 62 and a bottom surface 63. The front interface 61 has two signal ports 615, 617, each with a plurality of signal contacts 635, 637 therein for electrical connection with two transceiver modules respectively received in the lower and upper shielding cages 22, 21. Signals transmitted from the two transceiver modules are respectively delivered to a printed circuit board 4 (shown in FIG. 1) through the plurality of signal contacts 635, 637 of the signal ports 615 and 617, wherein the plurality of signal contacts 635, 637 extends from the bottom surface 63 of the electrical connector 6. A plurality of arch pins 613 protrudes from the front interface 61 and extends out from the bottom surface 63 as ground contacts 633 grounding with the printed circuit board 4. The arch pins 613 are for contacting with the spacer 3. A plurality of positioning pins 631 extends from the bottom surface 63, for positioning the electrical connector 6 on the printed circuit board 4. A plurality of inward pins 625 extends upwardly from the top surface 62. The inward pins 625 are made of elastic material.

In assembly, the retaining tabs 231 or mounting pins 234, 251, 254 of the dividing walls 23, 25 are respectively inserted into the first or second portions 211, 212, 221, 222 of the upper and lower shielding cages 21, 22, and the corresponding second or first portions 212, 211, 222, 221 of the shielding cages 21, 22 are assembled thereto to create completely assembled upper and lower shielding cages 21, 22. The second portion 222 of the lower shielding cage 22 is oriented upwardly, and the spacer 3 is mounted thereonto, the bulges 32 of the spacer 3 being positioned away from the second portion 222, and the mounting pins 251 of the lower dividing walls 25 being inserted into the press-fit holes 34 of the spacer 3. The upper shielding cage 21 fits onto the spacer 3, with the mounting pins 234 of the upper dividing wall 23 being inserted into the press-fit holes 34 of the spacer 3. The protrusions 237, 257 of the dividing walls 23, 25 come in complementary pairs. Thus, the upper shielding cage 21 and lower shielding cage 22 are stacked belly-to-belly, and the spacer 3 is sandwiched therebetween for providing good air ventilation. The hanger 1 encloses the upper and lower shielding cages 21, 22, with the retaining tabs 231 of the upper shielding cage 21 passing through corresponding slits 112 and hooking onto the hanger 1 for mechanical support and electrical grounding. Each channel formed inside the upper and lower shielding cages 21, 22 is used to receive a transceiver module. The electrical connectors 6 are received inside the metal hanger 1 between the dividing walls 23, 25 and side walls 12 to a rear of the channels. The inward pins 625 of the electrical connectors 6 are deformed inwardly and pass through the corresponding through holes 110 of the hanger 1. The bottom surface 63 of each electrical connector 6 is exposed from the hanger 1. The inward tabs 121 in the side walls 12 of the hanger 1 are inserted into the recesses 33 of the spacer 3, thereby locking the spacer 3 in the hanger 1. The back tabs 236, 256 of the upper and lower dividing walls 23, 25 protrude out of the rear wall 13 of the hanger 1 and are bent at an angle for mechanical retention to and electrical continuity with the hanger 1 for EMI shielding. The mounting pins 124 of the hanger 1 and the mounting pins 254 of the lower dividing walls 25 are pressed into mounting holes (not shown) of the printed circuit board 4 for retaining and grounding, where they can be soldered or otherwise fixed therein. The positioning pins 631 of the electrical connectors 6 are inserted into positioning holes (not shown) of the printed circuit board 4, and the signal contacts 635, 637 and the ground contacts 633 are respectively received into corresponding holes (not shown) of the printed circuit board 4 for transmitting signals or electrical grounding. An assembly of the shielding cage assembly 10, the electrical connectors 6, and the printed circuit board 4 is thus completed.

The spacer 3 of the present invention has a complex geometry which allows air to flow freely in all directions around the spacer 3 for facilitating the dissipation of heat from a dense assembly of transceiver modules received in the shielding cage assembly 10. A thickness of the spacer 3 can be easily adjusted for accommodating different spacing applications.

Although the present invention has been described with specific terms, it should be noted that the described embodiments are not necessarily exclusive, and that various changes and modifications may be made thereto without departing from the scope of the present invention as defined in the appended claims.

What is claimed is:

1. A transceiver module assembly comprising:
    a printed circuit board;
    a plurality of transceiver modules;
    a plurality of electrical connectors adapted to connect between the plurality of transceiver modules and the printed circuit board;
    a shielding cage assembly mounted to the printed circuit board for receiving the transceiver modules and the electrical connectors therein, while the shielding cage assembly, the transceiver modules and the electrical connectors are grounded with the printed circuit board, the shielding cage assembly comprising:
    at least one shielding cage;
    a spacer; and
    a hanger electrically grounding with the printed circuit board for providing EMI suppression; wherein
the at least one shielding cage and the spacer are mechanically retained in the hanger, and the spacer mechanically engages with the shielding cage for good air ventilation.

2. The transceiver module assembly as claimed in claim 1, wherein the at least one shielding cage includes an upper shielding cage and a lower shielding cage.

3. The transceiver module assembly as claimed in claim 2, wherein the upper shielding cage and the lower shielding cage are placed belly-to-belly, and the spacer is disposed between the upper and lower shielding cages.

4. The transceiver module assembly as claimed in claim 2, wherein the upper shielding cage and the lower shielding cage are electrically grounded to each other through the spacer.

5. The transceiver module assembly as claimed in claim 1, wherein the spacer defines at least one hole for free flowing of air.

6. The transceiver module assembly as claimed in claim 2, wherein a plurality of upper and lower dividing walls is respectively inserted into the upper and lower shielding cages to form a plurality of channels therein.

7. The transceiver module assembly as claimed in claim 6, wherein each of the upper and lower dividing walls is made of conductive material.

8. The transceiver module assembly as claimed in claim 6, wherein each upper dividing wall includes a plurality of retaining tabs for retaining to the hanger.

9. The transceiver module assembly as claimed in claim 6, wherein each lower dividing wall includes a plurality of mounting pins for being received in the printed circuit board.

10. The transceiver module assembly as claimed in claim 6, wherein a plurality of through holes is defined through the spacer to receive mounting pins respectively extending from the upper and lower dividing walls.

11. The transceiver module assembly as claimed in claim 1, wherein the at least one shielding cage is made of conductive material.

12. The transceiver module assembly as claimed in claim 1, wherein the spacer is made of electrically and thermally conductive material.

13. The transceiver module assembly as claimed in claim 1, wherein the hanger is made of conductive material.

14. A shielding cage assembly comprising:
    a lower shielding cage and an upper shielding cage, which are stacked belly-to-belly;
    a spacer disposed between the lower and upper shielding cages for providing good air ventilation and providing electrical and thermal conductivities for EMI continuity and heat dissipation in the shielding cage assembly; and
    a conductive hanger covering the lower and upper shielding cages and the spacer for providing EMI suppression; wherein
    a plurality of electrical connectors are provided around rear portions of said the lower and upper shielding cages.

15. The shielding cage assembly as claimed in claim 14, wherein the upper shielding cage and the lower shielding cage are electrically grounded to each other through the spacer.

16. The shielding cage assembly as claimed in claim 14, wherein the spacer defines at least one hole for free flowing of air.

17. The shielding cage assembly as claimed in claim 14, wherein a plurality of upper and lower dividing walls is respectively inserted into the upper and lower shielding cages to form a plurality of channels therein.

18. The shielding cage assembly as claimed in claim 17, wherein each upper dividing wall includes a plurality of retaining tabs for retaining to the hanger.

19. The shielding cage assembly as claimed in claim 17, wherein a plurality of through holes is defined through the spacer to receive mounting pins respectively extending from the upper and lower dividing walls.

20. A shielding cage assembly comprising:
    a printed circuit board;
    a U-shaped hanger located upon the printed circuit board and cooperating with the printed circuit board to form therein a cavity under a top wall of the hanger along a front-to-back direction, said cavity defining a first width along a lateral direction perpendicular to said front-to-back direction;
    a unitary shielding cage defining a second width along said lateral direction; and
    a plurality of vertical dividing walls disposed in the shielding cage and separating the shielding cage into a plurality of transceiver receiving spaces;
    wherein
    each of said dividing walls includes at least one retaining tab extending through a top face of the shielding cage to not only fasten the corresponding dividing wall to the shielding cage but also fasten the corresponding dividing wall to the hanger so as to have the shielding cage retainably located in the cavity.

21. The assembly claimed in claim 20, wherein the first width is substantially equal to the second width.

22. The assembly claimed in claim 20, wherein said retaining tab further extends through the top wall of the hanger.

* * * * *